(12) United States Patent
Palomba et al.

(10) Patent No.: US 12,217,806 B2
(45) Date of Patent: Feb. 4, 2025

(54) TECHNIQUES FOR THRESHOLD VOLTAGE SCANS

(71) Applicant: Micron Technology, Inc., Boise, ID (US)

(72) Inventors: Aniello Palomba, Marigliano (IT); Ciro Feliciano, Casandrino (IT); Antonio Imperiale, Caserta (IT)

(73) Assignee: Micron Technology, Inc., Boise, ID (US)

( * ) Notice: Subject to any disclaimer, the term of this patent is extended or adjusted under 35 U.S.C. 154(b) by 245 days.

(21) Appl. No.: 17/871,234

(22) Filed: Jul. 22, 2022

(65) Prior Publication Data

US 2024/0029800 A1 Jan. 25, 2024

(51) Int. Cl.
*G11C 16/34* (2006.01)
*G11C 16/26* (2006.01)
*G11C 16/04* (2006.01)

(52) U.S. Cl.
CPC .............. *G11C 16/34* (2013.01); *G11C 16/26* (2013.01); *G11C 16/0483* (2013.01)

(58) Field of Classification Search
CPC ...... G11C 16/34; G11C 16/26; G11C 16/0483; G11C 2029/0409
USPC ........................................................ 365/185.18
See application file for complete search history.

(56) References Cited

U.S. PATENT DOCUMENTS

| | | | |
|---|---|---|---|
| 10,950,308 B2 * | 3/2021 | Sforzin | G11C 11/24 |
| 2021/0125673 A1 * | 4/2021 | Tachi | G11C 11/5628 |
| 2022/0317877 A1 * | 10/2022 | Bae | G11C 16/0483 |
| 2023/0187002 A1 * | 6/2023 | Kim | G11C 29/021 365/185.24 |
| 2024/0079073 A1 * | 3/2024 | Kil | G11C 11/5642 |

* cited by examiner

*Primary Examiner* — Fernando Hidalgo
(74) *Attorney, Agent, or Firm* — Holland & Hart LLP

(57) ABSTRACT

Methods, systems, and devices for threshold voltage scans are described. A memory device may receive a configuration for scanning a memory array during a scanning procedure. The memory device may read, during the scanning procedure, one or more memory cells of the memory array using a first voltage value that is indicated by the configuration. The memory device may store, during the scanning procedure, a first value in a first counter in response to reading the one or more memory cells of the memory array. The memory device may determine whether to terminate the scanning procedure in response to one or both of determining that the first quantity of memory cells satisfies a threshold quantity of memory cells or determining that the first voltage value satisfies a threshold voltage value to be scanned.

20 Claims, 7 Drawing Sheets

TECHNIQUES FOR THRESHOLD VOLTAGE SCANS

FIELD OF TECHNOLOGY

The following relates to one or more systems for memory, including techniques for threshold voltage scans.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

Figure 1:
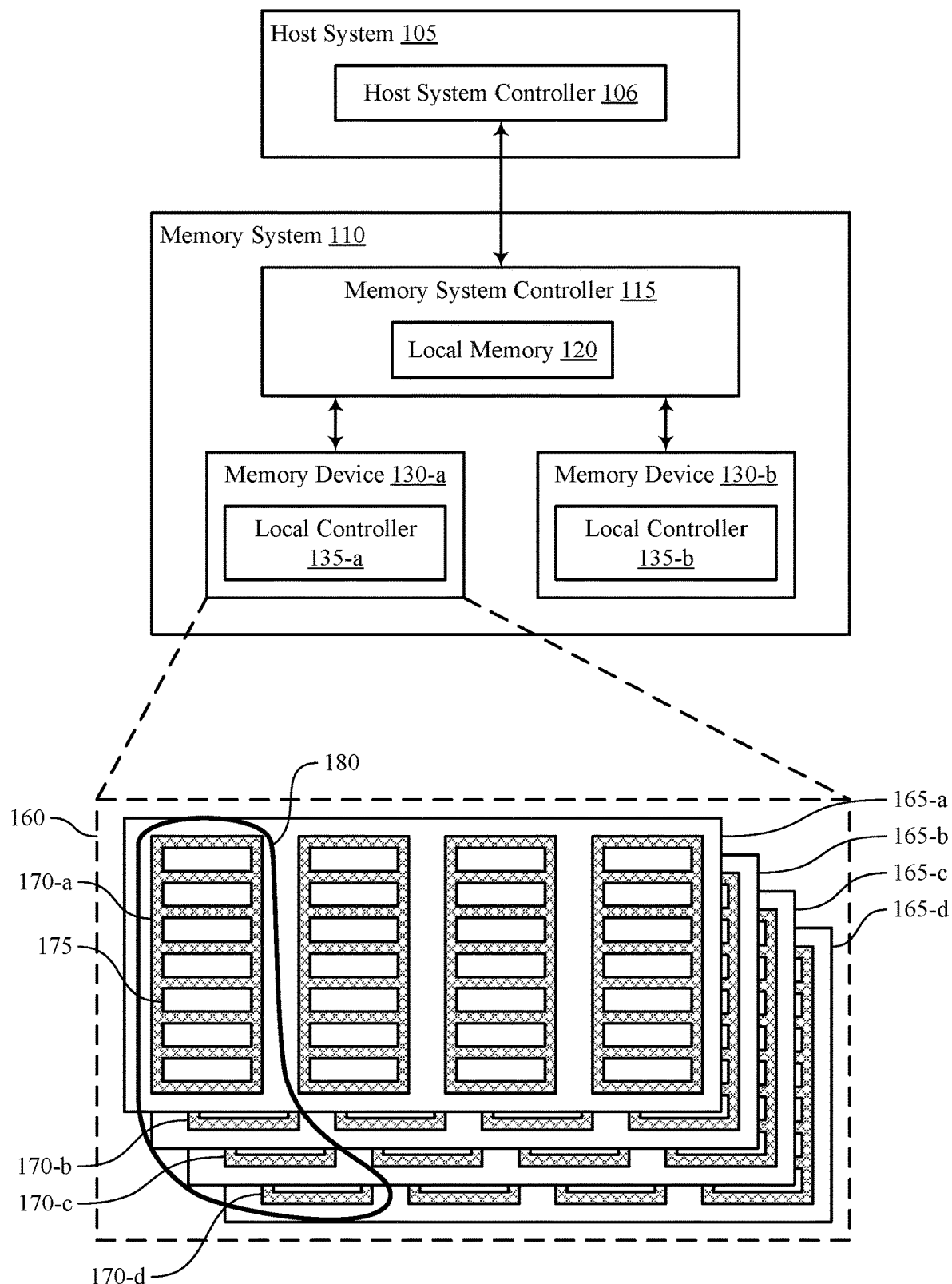
FIG. 1 illustrates an example of a system that supports techniques for threshold voltage scans in accordance with examples as disclosed herein.

A memory device may include memory cells that store multiple logic states. A logic state may correspond to a voltage stored in a memory cell. In some cases, a memory device may perform a read operation to determine a logic state stored in a memory cell. For example, a memory device may read a voltage stored in a memory cell and determine a corresponding logic state based on (e.g., using, sensing) the voltage. In some cases, a single logic state may correspond to a range or distribution of voltages. For example, physical variations among memory cells may lead to voltage variations for memory cells storing a same logic state. A distribution of voltages corresponding to a specific logic state may be referred to as a threshold voltage distribution. In some cases, an operation, such as a diagnostic operation (e.g., a threshold voltage scan), may be performed to determine threshold voltage distributions for memory cells of a memory device. For example, a threshold voltage scan may include performing read operations at voltage intervals (e.g., steps, increments) to determine quantities of memory cells that store each respective voltage.

In some cases, a threshold voltage scan may be performed with a set resolution. The resolution of a threshold voltage scan may be determined by a voltage step size (e.g., a voltage difference between voltage steps). For example, a higher resolution threshold voltage scan may have a smaller step size and a greater quantity of read operations compared to a lower resolution threshold voltage scan. Threshold voltage scans may be performed to determine threshold voltage distributions for operations (e.g., anticipated, estimated, projected, pending operations) of a memory device (e.g., to determine read thresholds for read operations). In some other cases, a threshold voltage scan may be performed for electronic failure analysis (EFA) or other troubleshooting operations. However, performing a threshold voltage scan may consume time and processing resources, among other issues, which may be undesirable. Additionally, or alternatively, some voltage ranges within the threshold voltage scan (e.g., flat regions of a voltage distribution) may not correspond to useful (e.g., relevant) data. For example, a flat region of a voltage distribution may include voltages that are not stored in memory cells of the memory device, but are still scanned. Accordingly, it may be undesirable for a step size (e.g., resolution) of a threshold voltage scan to be constant for the threshold scan (e.g., an entirety of the threshold scan). That is, it may be undesirable for a flat region (among other characteristics) of a voltage distribution to be scanned with a same resolution as a non-flat region (among other characteristics) of the voltage distribution.

In accordance with examples as disclosed herein, a resolution for a threshold voltage scan may be configured dynamically (e.g., during the threshold voltage scan, in response to determining whether a first counter value is equal to a second counter value). Additionally, or alternatively, the threshold voltage scan may terminate if a threshold quantity of memory cells have been scanned, if a read operation has been performed at a threshold voltage, if another condition has occurred, or any combination thereof. Dynamically configuring the resolution for the threshold voltage scan might reduce resource consumption during at least portions of the threshold voltage scan that do not yield as much relevant information. For example, a resolution of the threshold voltage scan may be decreased (e.g., by decreasing a quantity of voltages scanned) during a flat region of a voltage distribution, which may increase a speed of the threshold voltage scan. Additionally, or alternatively, the threshold voltage scan may be terminated after a threshold voltage is reached or a threshold quantity of memory cells are read, which may additionally increase a speed of the threshold voltage scan (e.g., by decreasing a quantity of voltages scanned).

Figure 2:
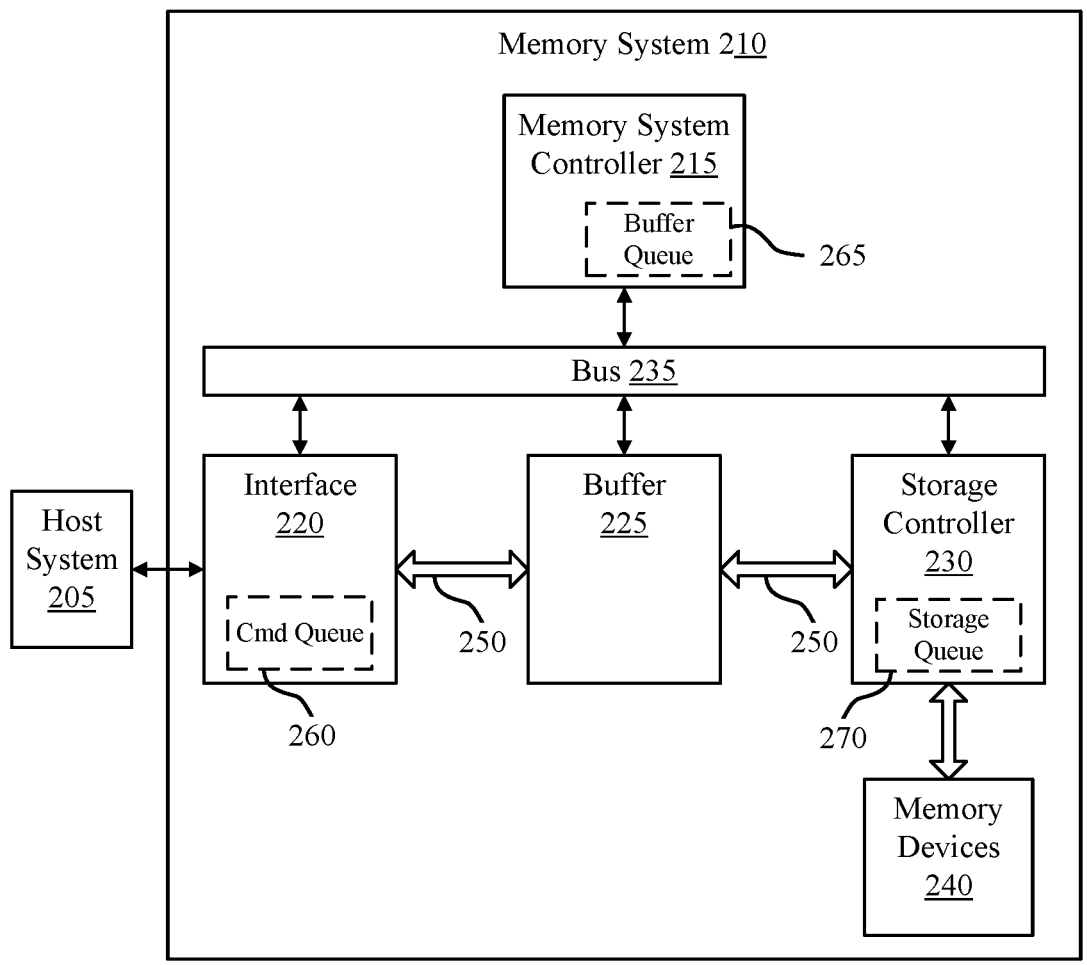
FIG. 2 illustrates an example of a system that supports techniques for threshold voltage scans in accordance with examples as disclosed herein.

Features of the disclosure are initially described in the context of systems with reference to FIGS. 1 through 2. Features of the disclosure are described in the context of voltage diagrams and a process flow with reference to FIGS. 3A through 4. These and other features of the disclosure are further illustrated by and described in the context of a block diagram and flowcharts that relate to techniques for threshold voltage scans with reference to FIGS. 5 through 7.

FIG. 1 illustrates an example of a system 100 that supports techniques for threshold voltage scans in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally, or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally, or alternatively, rely on an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may, in some cases, be performed instead by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally, or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally, or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may be performed on different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-a, 170-b, 170-c, and 170-d that are within planes 165-a, 165-b, 165-c, and 165-d, respectively, and blocks 170-a, 170-b, 170-c, and 170-d may be collectively referred to as a virtual block 180. In some cases, a virtual block may include blocks 170 from different memory devices 130 (e.g., including blocks in one or more planes of memory device 130-a and memory device 130-b). In some cases, the blocks 170 within a virtual block may have the same block address within their respective planes 165 (e.g., block 170-a may be "block 0" of plane 165-a, block 170-b may be "block 0" of plane 165-b, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

The system 100 may include any quantity of non-transitory computer readable media that support techniques for threshold voltage scans. For example, the host system 105 (e.g., a host system controller 106), the memory system 110 (e.g., a memory system controller 115), or a memory device 130 (e.g., a local controller 135) may include or otherwise may access one or more non-transitory computer readable media storing instructions (e.g., firmware, logic, code) for performing the functions ascribed herein to the host system 105, the memory system 110, or a memory device 130. For example, such instructions, if executed by the host system 105 (e.g., by a host system controller 106), by the memory system 110 (e.g., by a memory system controller 115), or by a memory device 130 (e.g., by a local controller 135), may cause the host system 105, the memory system 110, or the memory device 130 to perform associated functions as described herein.

A memory device 130 may determine a logic state stored in a memory cell of a memory device 130 based on (e.g., by comparing) a voltage stored in the memory cell and a threshold voltage distribution. For example, the memory device 130 may read a voltage stored in a memory cell and determine if the voltage is included in a threshold voltage distribution for a logic state. If the voltage is included in the voltage distribution, the memory device 130 may determine whether the memory cell stores the logic state. In some cases, the memory device 130 may determine a threshold voltage distribution. The memory device 130 may perform a diagnostic operation (e.g., a threshold voltage scan) to determine a threshold voltage distribution. In some cases, a threshold voltage scan may be performed for troubleshooting purposes (e.g., EFA). However, in some cases, performing a threshold voltage scan may result in extended scan times and extensive processing resources.

In accordance with examples as disclosed herein, a memory device 130 may configure (e.g., dynamically) a resolution for a threshold voltage scan, which may increase a speed of the threshold voltage scan, thereby reducing resource consumption, among other benefits. In some cases, a memory system controller 115 or a local controller 135 may configure the resolution to be used for the threshold voltage scan. In some cases, the memory device 130 may determine a resolution for the threshold voltage scan, for example, in response to evaluating one or more counter values (e.g., determining that a first counter value is equal to a second counter value). Additionally, or alternatively, the memory device 130 may determine whether to terminate the threshold voltage scan based on whether a threshold quantity of memory cells have been scanned, if a read operation has been performed at a threshold voltage, or both. Configuring the resolution for the threshold voltage scan may reduce resource consumption during portions of the threshold voltage scan that do not yield relevant information. For example, the memory device 130 may decrease a resolution of the threshold voltage scan (e.g., by decreasing a quantity of voltages scanned) during a flat region of a voltage distribution, which may increase a speed of the threshold voltage scan. Additionally, or alternatively, the memory device 130 may determine to terminate the threshold voltage scan after a quantity of data has been collected.

FIG. 2 illustrates an example of a system 200 that supports techniques for threshold voltage scans in accordance with examples as disclosed herein. The system 200 may be an example of a system 100 as described with reference to FIG. 1 or aspects thereof. The system 200 may include a memory system 210 configured to store data received from the host system 205 and to send data to the host system 205, if requested by the host system 205 using access commands (e.g., read commands or write commands). The system 200 may implement aspects of the system 100 as described with reference to FIG. 1. For example, the memory system 210 and the host system 205 may be examples of the memory system 110 and the host system 105, respectively.

The memory system 210 may include memory devices 240 to store data transferred between the memory system 210 and the host system 205, e.g., in response to receiving access commands from the host system 205, as described herein. The memory devices 240 may include one or more memory devices as described with reference to FIG. 1. For example, the memory devices 240 may include NAND memory, PCM, self-selecting memory, 3D cross point or other chalcogenide-based memories, FERAM, MRAM, NOR (e.g., NOR flash) memory, STT-MRAM, CBRAM, RRAM, or OxRAM.

The memory system 210 may include a storage controller 230 for controlling the passing of data directly to and from the memory devices 240, e.g., for storing data, retrieving data, and determining memory locations in which to store data and from which to retrieve data. The storage controller 230 may communicate with memory devices 240 directly or via a bus (not shown) using a protocol specific to each type of memory device 240. In some cases, a single storage controller 230 may be used to control multiple memory devices 240 of the same or different types. In some cases, the memory system 210 may include multiple storage controllers 230, e.g., a different storage controller 230 for each type of memory device 240. In some cases, a storage controller 230 may implement aspects of a local controller 135 as described with reference to FIG. 1.

The memory system 210 may additionally include an interface 220 for communication with the host system 205 and a buffer 225 for temporary storage of data being transferred between the host system 205 and the memory devices 240. The interface 220, buffer 225, and storage controller 230 may be for translating data between the host system 205 and the memory devices 240, e.g., as shown by a data path 250, and may be collectively referred to as data path components.

Using the buffer 225 to temporarily store data during transfers may allow data to be buffered as commands are being processed, thereby reducing latency between commands and allowing arbitrary data sizes associated with commands. This may also allow bursts of commands to be handled, and the buffered data may be stored or transmitted (or both) once a burst has stopped. The buffer 225 may include relatively fast memory (e.g., some types of volatile memory, such as SRAM or DRAM) or hardware accelerators or both to allow fast storage and retrieval of data to and from the buffer 225. The buffer 225 may include data path switching components for bi-directional data transfer between the buffer 225 and other components.

The temporary storage of data within a buffer 225 may refer to the storage of data in the buffer 225 during the execution of access commands. That is, after completion of an access command, the associated data may no longer be maintained in the buffer 225 (e.g., may be overwritten with data for additional access commands). In addition, the buffer 225 may be a non-cache buffer. That is, data may not be read directly from the buffer 225 by the host system 205. For example, read commands may be added to a queue without an operation to match the address to addresses already in the buffer 225 (e.g., without a cache address match or lookup operation).

The memory system 210 may additionally include a memory system controller 215 for executing the commands received from the host system 205 and controlling the data path components in the moving of the data. The memory system controller 215 may be an example of the memory system controller 115 as described with reference to FIG. 1. A bus 235 may be used to communicate between the system components.

In some cases, one or more queues (e.g., a command queue 260, a buffer queue 265, and a storage queue 270) may be used to control the processing of the access commands and the movement of the corresponding data. This may be beneficial, e.g., if more than one access command from the host system 205 is processed concurrently by the memory system 210. The command queue 260, buffer queue 265, and storage queue 270 are depicted at the interface 220, memory system controller 215, and storage controller 230, respectively, as examples of a possible implementation. However, queues, if used, may be positioned anywhere within the memory system 210.

Data transferred between the host system 205 and the memory devices 240 may take a different path in the memory system 210 than non-data information (e.g., commands, status information). For example, the system components in the memory system 210 may communicate with each other using a bus 235, while the data may use the data path 250 through the data path components instead of the bus 235. The memory system controller 215 may control how and if data is transferred between the host system 205 and the memory devices 240 by communicating with the data path components over the bus 235 (e.g., using a protocol specific to the memory system 210).

If a host system 205 transmits access commands to the memory system 210, the commands may be received by the interface 220, e.g., according to a protocol (e.g., a UFS protocol or an eMMC protocol). Thus, the interface 220 may be considered a front end of the memory system 210. After receipt of each access command, the interface 220 may communicate the command to the memory system controller 215, e.g., via the bus 235. In some cases, each command may be added to a command queue 260 by the interface 220 to communicate the command to the memory system controller 215.

The memory system controller 215 may determine whether an access command has been received based on (e.g., in response to) the communication from the interface 220. In some cases, the memory system controller 215 may determine that the access command has been received by retrieving the command from the command queue 260. The command may be removed from the command queue 260 after it has been retrieved therefrom, e.g., by the memory system controller 215. In some cases, the memory system controller 215 may cause the interface 220, e.g., via the bus 235, to remove the command from the command queue 260.

After a determination that an access command has been received, the memory system controller 215 may execute the access command. For a read command, this may mean obtaining data from the memory devices 240 and transmitting the data to the host system 205. For a write command, this may mean receiving data from the host system 205 and moving the data to the memory devices 240.

In either case, the memory system controller 215 may use the buffer 225 for, among other things, temporary storage of the data being received from or sent to the host system 205. The buffer 225 may be considered a middle end of the memory system 210. In some cases, buffer address management (e.g., pointers to address locations in the buffer 225) may be performed by hardware (e.g., dedicated circuits) in the interface 220, buffer 225, or storage controller 230.

To process a write command received from the host system 205, the memory system controller 215 may first determine whether the buffer 225 has sufficient available space to store the data associated with the command. For example, the memory system controller 215 may determine, e.g., via firmware (e.g., controller firmware), an amount of space within the buffer 225 that may be available to store data associated with the write command.

In some cases, a buffer queue 265 may be used to control a flow of commands associated with data stored in the buffer 225, including write commands. The buffer queue 265 may include the access commands associated with data currently stored in the buffer 225. In some cases, the commands in the command queue 260 may be moved to the buffer queue 265 by the memory system controller 215 and may remain in the buffer queue 265 while the associated data is stored in the buffer 225. In some cases, each command in the buffer queue 265 may be associated with an address at the buffer 225. That is, pointers may be maintained that indicate where in the buffer 225 the data associated with each command is stored. Using the buffer queue 265, multiple access commands may be received sequentially from the host system 205 and at least portions of the access commands may be processed concurrently.

If the buffer 225 has sufficient space to store the write data, the memory system controller 215 may cause the interface 220 to transmit an indication of availability to the host system 205 (e.g., a "ready to transfer" indication), e.g., according to a protocol (e.g., a UFS protocol or an eMMC protocol). As the interface 220 subsequently receives from the host system 205 the data associated with the write command, the interface 220 may transfer the data to the buffer 225 for temporary storage using the data path 250. In some cases, the interface 220 may obtain from the buffer 225 or buffer queue 265 the location within the buffer 225 to store the data. The interface 220 may indicate to the memory system controller 215, e.g., via the bus 235, if the data transfer to the buffer 225 has been completed.

Once the write data has been stored in the buffer 225 by the interface 220, the data may be transferred out of the buffer 225 and stored in a memory device 240. This may be done using the storage controller 230. For example, the memory system controller 215 may cause the storage controller 230 to retrieve the data out of the buffer 225 using the data path 250 and transfer the data to a memory device 240. The storage controller 230 may be considered a back end of the memory system 210. The storage controller 230 may indicate to the memory system controller 215, e.g., via the bus 235, that the data transfer to a memory device of the memory devices 240 has been completed.

In some cases, a storage queue 270 may be used to aid with the transfer of write data. For example, the memory system controller 215 may push (e.g., via the bus 235) write commands from the buffer queue 265 to the storage queue 270 for processing. The storage queue 270 may include entries for each access command. In some examples, the storage queue 270 may additionally include a buffer pointer (e.g., an address) that may indicate where in the buffer 225 the data associated with the command is stored and a storage pointer (e.g., an address) that may indicate the location in the memory devices 240 associated with the data. In some cases, the storage controller 230 may obtain from the buffer 225, buffer queue 265, or storage queue 270 the location within the buffer 225 from which to obtain the data. The storage controller 230 may manage the locations within the memory devices 240 to store the data (e.g., performing wear-leveling, performing garbage collection). The entries may be added to the storage queue 270, e.g., by the memory system controller 215. The entries may be removed from the storage queue 270 (e.g., by the storage controller 230 or memory system controller 215) after completion of the transfer of the data.

To process a read command received from the host system 205, the memory system controller 215 may again first determine whether the buffer 225 has sufficient available space to store the data associated with the command. For example, the memory system controller 215 may determine, e.g., via firmware (e.g., controller firmware), an amount of space within the buffer 225 that may be available to store data associated with the read command.

In some cases, the buffer queue 265 may be used to aid with buffer storage of data associated with read commands in a similar manner as discussed with respect to write commands. For example, if the buffer 225 has sufficient space to store the read data, the memory system controller 215 may cause the storage controller 230 to retrieve the data associated with the read command from a memory device 240 and store the data in the buffer 225 for temporary storage using the data path 250. The storage controller 230 may indicate to the memory system controller 215, e.g., via the bus 235, if the data transfer to the buffer 225 has been completed.

In some cases, the storage queue 270 may be used to aid with the transfer of read data. For example, the memory system controller 215 may push the read command to the storage queue 270 for processing. In some cases, the storage controller 230 may obtain from the buffer 225 or storage queue 270 the location within the memory devices 240 from which to retrieve the data. In some cases, the storage controller 230 may obtain from the buffer queue 265 the location within the buffer 225 to store the data. In some cases, the storage controller 230 may obtain from the storage queue 270 the location within the buffer 225 to store the data. In some cases, the memory system controller 215 may move the command processed by the storage queue 270 back to the command queue 260.

Once the data has been stored in the buffer 225 by the storage controller 230, the data may be transferred out of the buffer 225 and sent to the host system 205. For example, the memory system controller 215 may cause the interface 220 to retrieve the data out of the buffer 225 using the data path 250 and transmit the data to the host system 205, e.g., according to a protocol (e.g., a UFS protocol or an eMMC protocol). For example, the interface 220 may process the command from the command queue 260 and may indicate to the memory system controller 215, e.g., via the bus 235, that the data transmission to the host system 205 has been completed.

The memory system controller 215 may execute received commands according to an order (e.g., a first-in, first-out order, according to the order of the command queue 260). For each command, the memory system controller 215 may cause data corresponding to the command to be moved into and out of the buffer 225, as discussed herein. As the data is moved into and stored within the buffer 225, the command may remain in the buffer queue 265. A command may be removed from the buffer queue 265, e.g., by the memory system controller 215, if the processing of the command has been completed (e.g., if data corresponding to the access command has been transferred out of the buffer 225). If a command is removed from the buffer queue 265, the address previously storing the data associated with that command may be available to store data associated with a new command.

The memory system controller 215 may additionally be configured for operations associated with the memory devices 240. For example, the memory system controller 215 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., LBAs) associated with commands from the host system 205 and physical addresses (e.g., physical block addresses) associated with memory cells within the memory devices 240. That is, the host system 205 may issue commands indicating one or more LBAs and the memory system controller 215 may identify one or more physical block addresses indicated by the LBAs. In some cases, one or more contiguous LBAs may correspond to noncontiguous physical block addresses. In some cases, the storage controller 230 may be configured to perform one or more of the described operations in conjunction with or instead of the memory system controller 215. In some cases, the memory system controller 215 may perform the functions of the storage controller 230 and the storage controller 230 may be omitted.

In some cases, the memory system 210 or a subcomponent of the memory system 210 such as the memory system controller 215, the storage controller 230, or a memory device 240 may be configured to perform a diagnostic operation to determine one or more threshold voltage distributions. For example, the memory system controller 215 may perform a threshold voltage scan to determine one or more threshold voltage distributions for the memory devices 240. Performing a threshold voltage scan may include sequentially performing a quantity of read operations to determine quantities of memory cells that store specific voltages. In some cases, the memory device 240 may perform a threshold voltage scan for troubleshooting purposes. However, performing a threshold voltage scan may consume time and processing resources of the memory device 240.

In accordance with examples as disclosed herein, a memory system 210 (e.g., the memory system controller 215, the storage controller 230, or the memory device 240) may configure (e.g., dynamically) a resolution for a threshold voltage scan. In some cases, configuring the resolution for the threshold voltage scan may increase a speed of the threshold voltage scan, thereby reducing resource consumption. In some cases, the memory device 240 may determine a resolution for the threshold voltage scan in response to determining that a first counter value is equal to a second counter value. Additionally, or alternatively, the memory device 240 may determine whether to terminate the threshold voltage scan in response to determining that a threshold quantity of memory cells have been scanned, if a read operation has been performed at a threshold voltage, or both. Configuring the resolution for the threshold voltage scan may reduce resource consumption during portions of the threshold voltage scan that do not yield relevant or useful information. For example, the memory device 240 may increase a voltage step size of the threshold voltage scan during a flat region of a voltage distribution, which may increase a speed of the threshold voltage scan. Additionally, or alternatively, the memory device 240 may determine to terminate the threshold voltage scan after a quantity of memory cells have been read.

Figure 3A:
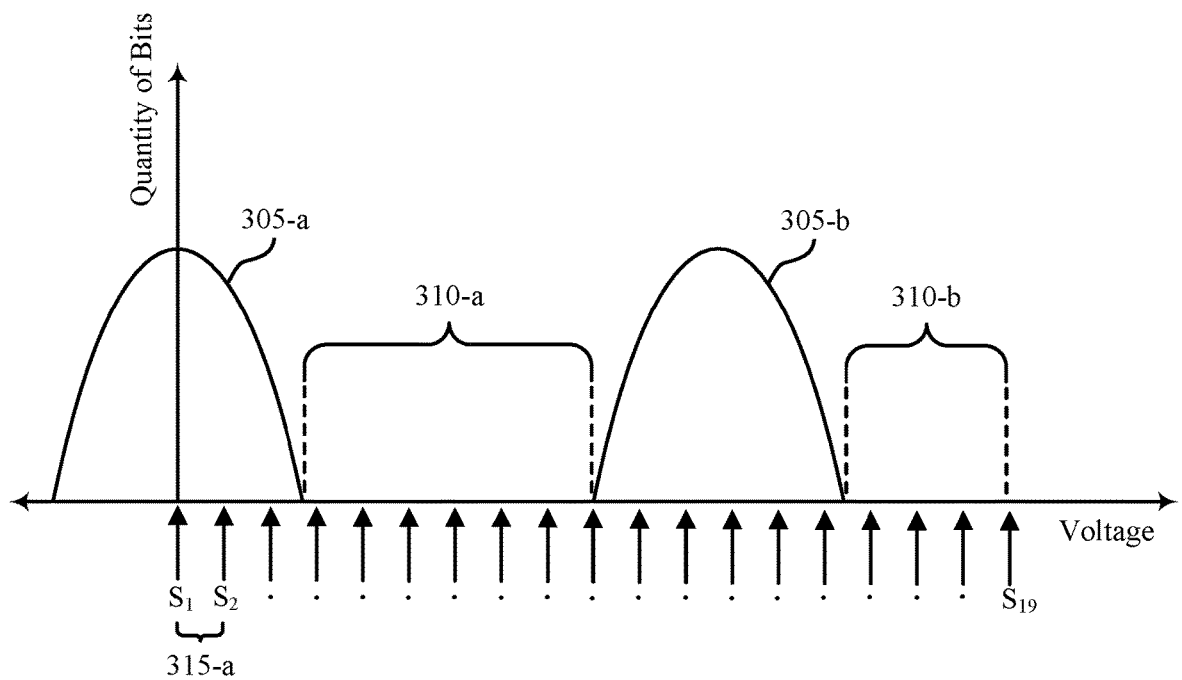
FIGS. 3A and 3B illustrate examples of voltage diagrams that support techniques for threshold voltage scans in accordance with examples as disclosed herein.

FIG. 3A illustrates an example of a voltage diagram 300-$a$ that supports techniques for threshold voltage scans in accordance with examples as disclosed herein. In some cases, one or more aspects of the voltage diagram 300-$a$ may represent one or more aspects of a system 100, as described with reference to FIG. 1, or a system 200, as described with reference to FIG. 2. For example, the voltage diagram 300-$a$ may include voltage distributions 305, which may be examples of voltage distributions 305 for a memory device 130, as described with reference to FIG. 1, or for a memory device 240, as described with reference to FIG. 2. The voltage diagram 300-$a$ may include a flat region 310-$a$ and a flat region 310-$b$. Although the flat regions 310-$a$ and 310-$b$ are shown as overall flat, in some examples, these flat regions 310 may include regions in which a quantity of bits varies, oscillates, or is otherwise different than a quantity of bits included in the voltage distributions 305-$a$ and 305-$b$. For example, the flat regions 310-$a$ and 310-$b$ may not have a quantity of bits that is uniformly zero, but instead may vary within a threshold value and may be relatively constant, but not uniformly constant. The voltage diagram 300-$a$ may represent one or more aspects of a threshold voltage scan with a voltage step size 315-$a$, which may be constant for a duration of the threshold voltage scan. The threshold voltage scan may include performing a quantity of read operations, where each read operation uses a read voltage in accordance with the voltage step size 315-$a$.

The voltage diagram 300-$a$ may include a voltage distribution 305-$a$ and a voltage distribution 305-$b$. The voltage distributions 305 may illustrate quantities of memory cells (e.g., quantities of bits) corresponding to sensed voltages. For example, a point on the voltage distribution 305-$a$ may represent a quantity of memory cells or a quantity of bits storing a respective voltage value. The memory cells with voltages on the voltage distribution 305-$a$ may be examples of memory cells previously written with a first logic value (e.g., a first logic state, a logic 1) and the memory cells with voltages on the voltage distribution 305-$b$ may be examples of memory cells previously written with a second logic value (e.g., a second logic state, a logic 0). Although shown as parabolic curves for illustrative clarity, it is to be understood that the voltage distributions 305 may be any shape or associated with any logic value. Additionally, or alternatively, a voltage diagram 300 may include more than two voltage distributions 305 and more than two flat regions 310.

A memory device may determine a logic value stored in a memory cell based on a read threshold (e.g., a threshold voltage, a reference voltage, an evaluation voltage, a voltage used in a read operation) (not shown). The read threshold may be determined based on the voltage distributions 305. For example, a read threshold may be a read voltage at a midpoint between the voltage distribution 305-$a$ and the voltage distribution 305-$b$. A memory device may sense a signal output (e.g., a current output, a voltage output) of a memory cell during a read operation and determine a logic state stored in the memory cell based on the signal output. For example, the memory device may determine that the memory cell stores a first logic state if the signal output, or associated cell characteristic (e.g., a threshold voltage of the memory cell), is less than the read threshold, or that the memory cell stores a second logic state if the signal output, or associated cell characteristic, is greater than the read threshold. Accordingly, it may be desirable for a memory device to accurately determine or otherwise operate in accordance with the voltage distributions 305 for a memory device.

To determine voltage distributions 305, a memory device may perform a diagnostic procedure, such as a threshold voltage scan. Performing a threshold voltage scan may include performing a quantity of read operations to determine quantities of memory cells that store specific voltages (e.g., voltage distributions 305, threshold voltage distributions). In some cases, each read operation of a threshold voltage scan may be referred to as a "step." Each step may correspond to a specific read voltage. As an illustrative example, and as shown in FIG. 3A, a memory device may determine the voltage distribution 305-$a$ and the voltage distribution 305-$b$ by performing a threshold voltage scan that includes multiple steps (e.g., steps: $S_1$-$S_{19}$). In some other cases, a threshold voltage scan may include a different quantity of steps.

At a first step, $S_1$, of a threshold voltage scan, a memory device may perform a first read operation on a set of memory cells. The memory device may perform the first read operation using a first voltage. In response to the first read operation, the memory device may determine a first quantity of memory cells that store the first voltage (e.g., a subset of the set of memory cells). The first quantity of memory cells that store the first voltage may correspond to a first point on the voltage distribution 305-$a$. As part of the threshold voltage scan, the memory device may perform additional read operations on the set of memory cells. The memory device may thereby incrementally determine quantities of memory cells that store respective voltages.

For example, at a second step, $S_2$, of the threshold voltage scan, the memory device may perform a second read operation on the set of memory cells. The memory device may perform the second read operation using a second voltage greater than the first voltage. In response to the second read operation, the memory device may determine a second quantity of memory cells that store the second voltage. The second quantity of memory cells that store the second voltage may correspond to a second point on the voltage distribution 305-$a$. For example, the second quantity of memory cells may be less than the first quantity of memory cells.

The memory device may perform read operations at each step of the threshold voltage scan until a threshold quantity (e.g., a maximum quantity, a configured quantity) of steps has been reached. For example, the threshold voltage diagram described with reference to FIG. 3A may include 19 steps. Accordingly, the memory device may perform 19 read operations and may terminate (e.g., exit) the threshold voltage scan after completion of the 19th read operation. Each step of the threshold voltage scan (e.g., each read operation of the threshold voltage scan) may have a duration. A duration of the threshold voltage scan (e.g., an overall duration of a threshold voltage scan with a fixed resolution) may be determined by multiplying the quantity of steps included in the threshold voltage scan by a step duration.

The voltage diagram 300-*a* may include flat regions 310. A flat region 310 may correspond to voltages not stored in memory cells of the memory device. For example, a flat region 310 may include voltages not included in voltage distributions 305. A flat region 310-*a* may be an example of a portion of the voltage diagram 300-*a* between the voltage distribution 305-*a* and the voltage distribution 305-*b*. A flat region 310-*b* may be an example of a portion of the voltage diagram 300-*a* including voltages greater than a highest voltage included in the voltage distribution 305-*b*. In some other cases, a flat region 310 (not shown) may be an example of a portion of the voltage diagram 300-*a* including voltages less than a lowest voltage included in the voltage distribution 305-*a*.

The threshold voltage scan described with reference to FIG. 3A may be an example of a threshold voltage scan with a fixed (e.g., static) resolution. For example, a memory device may perform read operations according to the voltage step size 315-*a* for a duration of the threshold voltage scan. However, performing a threshold voltage scan may consume processing resources. In some cases, resource consumption during a threshold voltage scan may be a function of a quantity of steps (e.g., read operations) included in the threshold voltage scan. For example, as a voltage step size 315 decreases, a quantity of read operations included in the threshold voltage scan may increase, resulting in an increased duration of a threshold voltage scan. Accordingly, it may be desirable to minimize or reduce a quantity of read operations included in a threshold voltage scan.

Figure 3B:
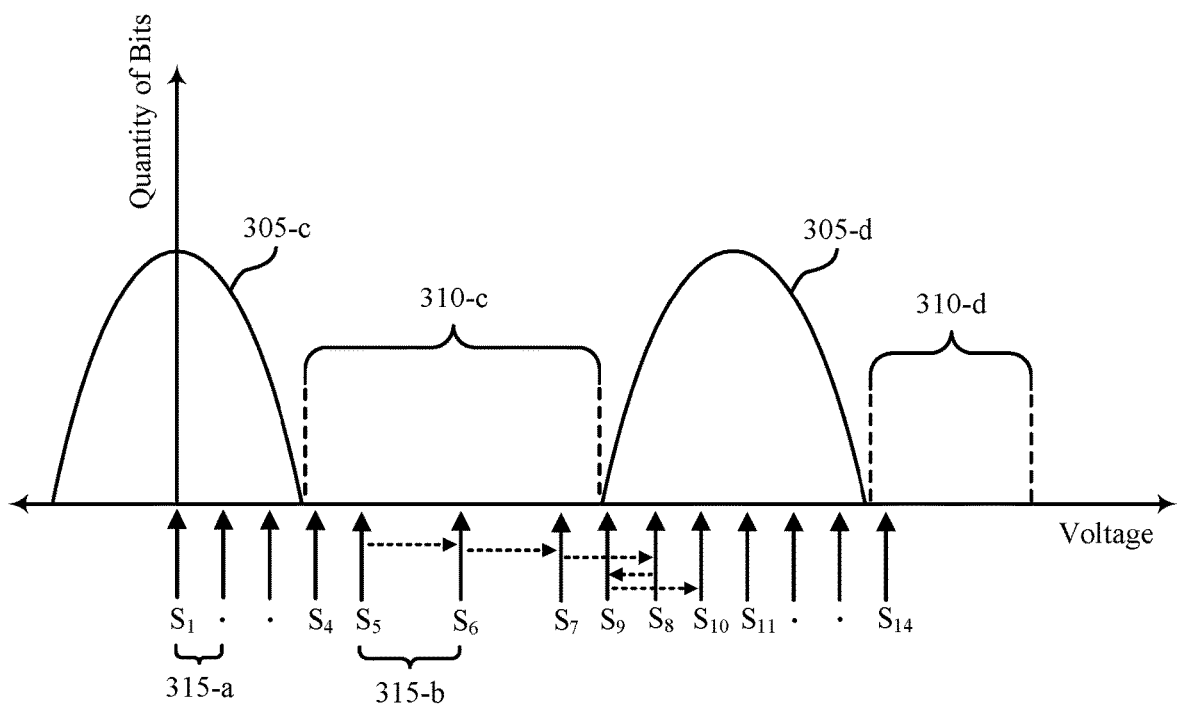

FIG. 3B illustrates an example of a voltage diagram 300-*b* that supports techniques for threshold voltage scans in accordance with examples as disclosed herein. In some cases, one or more aspects of the voltage diagram 300-*b* may represent one or more aspects of a system 100, as described with reference to FIG. 1, or a system 200, as described with reference to FIG. 2. For example, the voltage diagram 300-*b* may include voltage distributions 305, which may be examples of voltage distributions 305 for a memory device 130, as described with reference to FIG. 1, or for a memory device 240, as described with reference to FIG. 2. In some cases, the voltage diagram 300-*b* may include a flat region 310-*c* and a flat region 310-*d*. Although flat regions 310-*c* and 310-*d* are shown as overall flat, in some examples, these flat regions 310 may include regions in which a quantity of bits varies, oscillates, or is otherwise different than a quantity of bits included in voltage distributions 305-*a* and 305-*b*. For example, the flat regions 310-*c* and 310-*d* may not have a quantity of bits that is uniformly zero, but instead may vary within a threshold value and may be relatively constant, but not uniformly constant. The voltage diagram 300-*b* may represent one or more aspects of a threshold voltage scan with a configurable resolution. For example, a memory device may perform the threshold voltage scan using a voltage step size 315-*a* for a first duration and a voltage step size 315-*b* for a second duration.

The voltage diagram 300-*b* may include a voltage distribution 305-*c* and a voltage distribution 305-*d*. The voltage distributions 305 may illustrate quantities of memory cells (e.g., quantities of bits) corresponding to sensed voltages. For example, a point on the voltage distribution 305-*c* may represent a quantity of memory cells or a quantity of bits storing a respective voltage value. The memory cells with voltages on the voltage distribution 305-*c* may be examples of memory cells previously written with a first logic value (e.g., 1) and the memory cells with voltages on the voltage distribution 305-*d* may be examples of memory cells previously written with a second logic value (e.g., 0). Although shown as parabolic curves for illustrative clarity, it is to be understood that the voltage distributions 305 may be any shape or associated with any logic value. Additionally, or alternatively, a voltage diagram 300 may include more than two voltage distributions 305 and more than two flat regions 310.

A memory device may be configured to determine one or more voltage distributions 305 using a diagnostic procedure, such as a threshold voltage scan. Performing a threshold voltage scan may include performing a quantity of read operations to determine quantities of memory cells that store specific voltages (e.g., voltage distributions 305). A threshold voltage scan may include multiple steps (e.g., multiple read operations). As an illustrative example, and as shown in FIG. 3B, a memory device may determine the voltage distribution 305-*c* and the voltage distribution 305-*d* by performing a threshold voltage scan that includes 14 steps (e.g., 14 read operations). In other cases, a threshold voltage scan may include a different quantity of steps.

The voltage diagram 300-*b* may include one or more flat regions 310. A flat region 310 may correspond to voltages not stored in memory cells of the memory device. For example, a flat region 310 may include voltages not included in voltage distributions 305. A flat region 310-*a* may be an example of a portion of the voltage diagram 300-*b* between the voltage distribution 305-*c* and the voltage distribution 305-*d*. A flat region 310-*d* may be an example of a portion of the voltage diagram 300-*b* including voltages greater than a maximum voltage of the voltage distribution 305-*d*. In some other cases, a flat region 310 (not shown) may include voltages less than a minimum voltage included in the voltage distribution 305-*c*.

In accordance with examples as disclosed herein, a memory device may dynamically configure a resolution of a threshold voltage scan, which may reduce resource consumption for the threshold voltage scan. The threshold voltage scan described with reference to FIG. 3B may be an example of a threshold voltage scan with a configurable (e.g., dynamic) resolution. For example, a memory device may decrease a resolution of the threshold voltage scan for a portion of the flat region 310-*c* and may determine not to perform the threshold voltage scan for a portion of the flat region 310-*d*. In some other cases, a memory device may decrease a resolution of the threshold voltage scan for a portion (e.g., a full duration, a full span of threshold voltages) of the flat region 310-*c*. Additionally, or alternatively, a memory device may determine to terminate the threshold voltage scan without entering the flat region 310-*d*. For example, the memory device may determine not to perform a read operation using a read voltage included in the flat region 310-*d*.

As described herein, a memory device may determine (e.g., dynamically) a resolution for the threshold voltage scan (e.g., whether to use a voltage step size 315-*a* or a voltage step size 315-*b*) based on whether a first quantity of memory cells storing a first voltage is different from a second quantity of memory cells storing a second voltage. For example, at a fourth step, $S_4$, in a threshold voltage scan, a memory device may perform a fourth read operation at a fourth voltage, which may be greater than a maximum voltage of the voltage distribution 305-*c*. The memory device may determine a fourth quantity of memory cells that store the fourth voltage. In some cases, the fourth quantity of memory cells may be zero if the fourth voltage is greater than the maximum voltage of the voltage distribution 305-c.

At a fifth step in the threshold voltage scan, $S_5$, the memory device may perform a fifth read operation at a fifth voltage, which may also be greater than a maximum voltage of the voltage distribution 305-c. The memory device may determine a fifth quantity of memory cells that store the fifth voltage. In some cases, the fifth quantity of memory cells may be zero if the fifth voltage is greater than the maximum voltage of the voltage distribution 305-c. Accordingly, prior to performing the sixth step of the threshold voltage scan, $S_6$, the memory device may determine to decrease a resolution of the threshold voltage scan (e.g., increase a voltage step size, use the voltage step size 315-b) in response to determining that the fourth quantity of memory cells is a same quantity as the fifth quantity of memory cells. For example, the memory device may perform the sixth step of the threshold voltage scan, $S_6$, using a sixth voltage, which may be determined based on the fifth voltage and the voltage step size 315-b.

The memory device may perform seventh read operation and an eighth read operation at the steps $S_7$, and $S_8$, respectively. For example, at $S_7$, the memory device may perform a seventh read operation and determine a seventh quantity of memory cells. At $S_8$, the memory device may perform an eighth read operation and determine an eighth quantity of memory cells. At $S_8$, the memory device may determine whether (e.g., that) the eighth quantity of memory cells is different from the seventh quantity of memory cells. For example, the seventh quantity of memory cells may be 0 and the eighth quantity of memory cells may be greater than zero. In response to determining that the eighth quantity of memory cells is different from the seventh quantity of memory cells (e.g., the threshold voltage scan has exited the flat region 310-c), the memory device may determine, at $S_9$, to perform a ninth read operation at a ninth voltage less than an eighth voltage for the eighth read operation (e.g., the memory device may reverse a direction of the threshold voltage scan for a duration).

At $S_{10}$, the memory device may perform a tenth read operation at a tenth voltage (e.g., the tenth voltage may be greater than the eighth voltage). The memory device may determine the tenth voltage by incrementing the ninth voltage by the voltage step size 315-b and may determine an eleventh voltage for step $S_{11}$ by incrementing the tenth voltage by the voltage step size 315-a. That is, the memory device may determine to increase the resolution of the threshold voltage scan for steps $S_{11}$ through $S_{14}$. Accordingly, the threshold voltage scan may have a higher granularity for voltages included in the voltage distribution 305-d (e.g., a portion of voltages included in the voltage distribution 305-d) than in the flat region 310-c. Although the illustrative example described with reference to the voltage diagram 300-b shows one instance of the threshold voltage scan reversing direction for a duration (e.g., $S_9$ uses a lower read voltage than $S_8$), a threshold voltage scan may include multiple instances of reversing direction. For example, a memory device may perform an iterative process of stepping forwards and backwards to determine a resolution for a threshold voltage scan.

In some cases, as part of a threshold voltage scan, the memory device may determine to avoid performing multiple read operations at a same voltage. In some cases, the memory device may determine whether to use the voltage step size 315-a or the voltage step size 315-b based on whether using the voltage step size 315-a or using the voltage step size 315-b will result in performing a read operation at a respective voltage more than once. For example, the memory device may determine the tenth voltage for step $S_{10}$ by incrementing the ninth voltage for $S_9$ by the voltage step size 315-b. The memory device may determine to use the voltage step size 315-b (e.g., to not use the voltage step size 315-a) to avoid performing a second read operation at the eighth voltage for $S_8$. In some cases, avoiding performing multiple read operations at a same voltage may increase a speed of a threshold voltage scan and conserve processing resources.

In some cases, a memory device may be configured with a threshold read voltage, which may correspond to an upper limit for a voltage storing capability of a memory cell. The memory device may determine to terminate the threshold voltage scan in response to a read voltage being equal to the threshold read voltage. For example, at a fourteenth step of the threshold voltage scan, $S_{14}$, the memory device may perform a read operation at a fourteenth voltage. The fourteenth voltage may be equal to the threshold read voltage (e.g., the upper limit for the voltage storing capability of the memory cell). In response to the fourteenth voltage being equal to the threshold read voltage, the memory device may determine to terminate the threshold voltage scan. That is, the memory device may determine to terminate the threshold voltage scan prior to scanning a portion of the flat region 310-d. Accordingly, refraining from scanning a portion of the flat region 310-d may conserve processing resources.

Additionally, or alternatively, a memory device may be configured with a threshold quantity of memory cells, which may correspond to a total quantity of memory cells included in the memory device. The memory device may determine to terminate the threshold voltage scan in response to a quantity of memory cells being equal to the threshold quantity of memory cells. For example, a memory device may store a value in a counter that indicates a quantity of memory cells counted during a threshold voltage scan. For example, the counter may be incremented for each memory cell that stores a read voltage included in the threshold voltage scan. In some cases, a memory device may determine to terminate the threshold voltage scan if the counter value is equal to the threshold quantity of memory cells. Accordingly, terminating the threshold voltage scan if the counter value is equal to the threshold quantity of memory cells may conserve processing resources.

Figure 4:
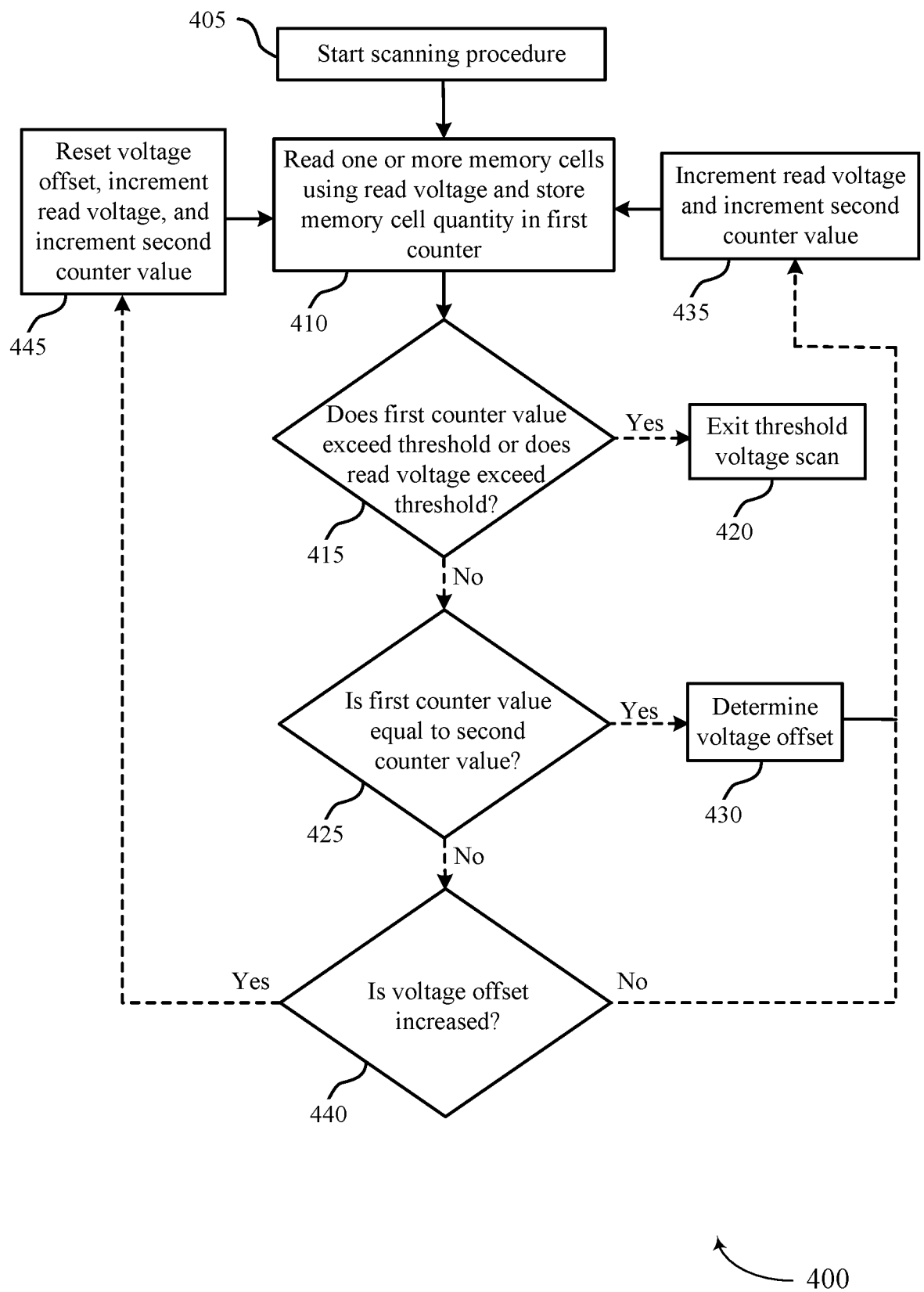
FIG. 4 illustrates an example of a process flow that supports techniques for threshold voltage scans in accordance with examples as disclosed herein.

FIG. 4 illustrates an example of a process flow 400 that supports techniques for threshold voltage scans in accordance with examples as disclosed herein. In some cases, one or more aspects of the process flow 400 may be implemented by one or more aspects of the system 100, as described with reference to FIG. 1, or the system 200, as described with reference to FIG. 2. For example, a memory system 110, a memory system controller 115, a memory device 130, or a local controller 135, as described with reference to FIG. 1, may implement one or more aspects of the process flow 400. Additionally, or alternatively, a memory system 210, a memory system controller 215, an interface 220, a storage controller 230, or a memory device 240, as described with reference to FIG. 2, may implement one or more aspects of the process flow 400.

One or more aspects of the process flow 400 may be implemented as instructions stored in memory (e.g., firmware stored in a memory coupled with a memory system 110). For example, the instructions, if executed by a controller (e.g., the memory system controller 115), may cause the controller to perform the operations of the process flow 400. In the following description of the process flow 400, the operations may occur in a different order than the order shown, or the operations may be performed at different times. Some operations may also be left out of process flow 400, or other operations may be added to process flow 400.

Aspects of the process flow 400 may be implemented by a controller, among other components. Additionally, or alternatively, aspects of the process flow 400 may be implemented as instructions stored in memory (e.g., firmware stored in a memory coupled with a memory system controller 115. For example, the instructions, if executed by a controller (e.g., the memory system controller 115), may cause the controller to perform the operations of the process flow 400. In some other cases, aspects of the process flow may be implemented by a memory device (e.g., memory device 130).

At 405, a scanning procedure may start. For example, a memory device may initiate a scanning procedure, such as a threshold voltage scan. In some cases, initiating the scanning procedure may include initializing one or more values or counters. For example, the memory device may initiate the scanning procedure by setting a value of a read voltage to zero, setting a value of a first counter to zero, setting a value of a second counter to zero, or any combination thereof. Additionally, or alternatively, the memory device may initiate the scanning procedure by determining a voltage step size value and an initial voltage offset value for the scanning procedure. In some cases, the initial voltage offset value may be equal to the voltage step size. In some cases, the memory device may receive a configuration for the scanning procedure. The configuration may include an initial value for a read voltage, a first counter, a second counter, a voltage step size, an initial voltage offset value or any combination thereof.

At 410, one or more memory cells of a memory array of the memory device may be read using a first voltage value. For example, the memory device may read one or more memory cells of a memory array using a first voltage value. The first voltage value may be equal to the initial value for the read voltage. The memory device may perform the read operation in response to receiving the configuration for the scanning procedure, which may include an indication of the first voltage. In some cases, the first voltage may be zero volts. Additionally, or alternatively, the memory device may store a first value (e.g., a quantity of memory cells that satisfy a threshold in response to the read operation) in a first counter. The first value may be based on a value (e.g., a read signal) read from the one or more memory cells of the memory array. The first value may be a first quantity of memory cells of the memory array (e.g., a first quantity of memory cells that store the first voltage).

At 415, a determination may be made as to whether to terminate the scanning procedure (e.g., based on whether a condition has been met). For example, the memory device may determine that the first quantity of memory cells satisfies a threshold quantity of memory cells, that the first voltage value satisfies a threshold voltage, or both. In some cases, a threshold quantity of memory cells may be a quantity of memory cells included in the memory array. A threshold voltage value may be a maximum voltage for a memory cell. Performing a read operation at the threshold voltage value or determining that each memory cell included in the memory array has been counted may indicate that the scanning procedure has completed. The memory device may accordingly determine to terminate the scanning procedure.

In some cases, the memory device may determine to refrain from terminating the scanning procedure in response to determining that the first quantity of memory cells fails to satisfy the threshold quantity of memory cells or the first voltage value fails to satisfy the threshold voltage value, or both. Determining to refrain from terminating the scanning procedure may include proceeding to 425. In some other cases, the memory device may determine to terminate the scanning procedure in response to determining that the first quantity of memory cells satisfies the threshold quantity of memory cells or the first voltage satisfies the threshold voltage value, or both.

At 420, the scanning procedure may be terminated. For example, the memory device may terminate the scanning procedure in response to determining that the first quantity of memory cells satisfies the threshold quantity of memory cells or the first voltage value satisfies the threshold voltage value, or both. In some cases, the memory device may determine that relevant data for the threshold voltage scan has been determined and may terminate the scanning procedure in response to the determination. The memory device may terminate the scanning procedure in response to determining that a read voltage for the threshold voltage scan is included in a flat region of a voltage distribution (e.g., flat region 310-d). Terminating the scanning procedure may accordingly prevent the memory device from consuming resources associated with one or more flat regions of a voltage distribution.

At 425, if the scanning prior is not terminated, a determination may be made as to whether the first value stored in the first counter is equal to a first value stored in a second counter. For example, the memory device may determine to refrain from terminating the scanning procedure and may determine whether the first value stored in the first counter is equal to the first value stored in the second counter. The second counter may be configured to store values previously stored in the first counter. In some cases, the first counter may store an initial value of zero for a first iteration of the scanning procedure. In some cases, the memory device may utilize the second counter to store values previously stored in the first counter. In some other cases, the memory device may store the values previously stored in the first counter using a system variable.

At 430, a first voltage offset value may be determined in response to determining that the first value stored in the first counter is equal to the first value stored in the second counter. For example, the memory device may determine the first voltage offset value in response to determining that the first value stored in the first counter is equal to the first value stored in the second counter. In some cases, determining that the first value is equal to the second value may indicate that a first voltage for the scanning procedure is included in a flat region of a voltage distribution. In some cases, the first voltage offset value may be determined from a voltage step size value. As described herein, the voltage step size value may be received in a configuration for the scanning procedure. In some cases, the first voltage offset value may be an integer multiple of the voltage step size value. For example, the first voltage offset value may be equal to the voltage step size value multiplied by two. Additionally, or alternatively, the first voltage offset value may be greater than an initial voltage offset value.

At 435, a second voltage value may be determined based on the first voltage value and the first voltage offset value. For example, the memory device may determine the second voltage value based on the first voltage value and the first voltage offset value. The second voltage value may be for performing a second read operation as part of the scanning procedure. In some cases, the memory device may determine the second voltage value by adding the first voltage offset value to the first voltage value. In some cases, the memory device may determine the second voltage value based on whether one or more parameters indicate that a read operation has been performed at the second voltage value. For example, the memory device may be configured to avoid performing multiple read operations at a same voltage. Accordingly, the memory device may determine the second voltage to be different from one or more voltages used for one or more previous read operations during the threshold voltage scan.

In some cases, a memory device may determine the second voltage value by incrementing the first voltage value by a voltage step size. In some cases, the memory device may select (e.g., determine) the voltage step size such that the second voltage is different from one or more previous voltages for read operations performed as part of the threshold voltage scan. Additionally, or alternatively, the memory device may store, in the second counter, the first value stored in the first counter. In response to determining the second voltage value, the memory device may perform a second iteration of the scanning procedure. For example, the memory device may perform the second iteration of the scanning procedure using the second voltage value for a read operation of the scanning procedure.

At 440, a determination may be made as to whether the second voltage offset is equal to a multiple of the voltage step size value. For example, the memory device may determine whether the second voltage offset value is equal to the multiple of the voltage step size value. The second voltage offset value may be an initial voltage offset value or a voltage offset value used for a previous iteration of the scanning operation (e.g., the first voltage offset value). The memory device may determine if the second voltage offset value is equal to the first voltage offset value. In some cases, the memory device may determine whether to reset the second voltage offset value in response to determining that the second voltage offset value is equal to the first voltage offset value. In some cases, the memory device may determine whether the second voltage offset value is greater than the initial voltage offset value.

At 445, the second voltage value may be determined based on the first voltage value and the first voltage offset value. For example, the memory device may determine the second voltage value based on to the first voltage value and the first voltage offset value. The second voltage value may be for performing a read operation as part of the scanning procedure. In some cases, a memory device may determine the second voltage value based on determining that the second voltage offset value is different from a multiple of the voltage step size value (e.g., the second voltage offset value is equal to the voltage step size value). The memory device may store, in the second counter, the first value stored in the first counter. For example, the memory device may update the second counter with the first value stored in the first counter. Additionally, or alternatively, the memory device may determine a third voltage offset value that is equal to the voltage step size. In response to determining the second voltage value, the memory device may perform a second iteration of the scanning procedure.

Figure 5:
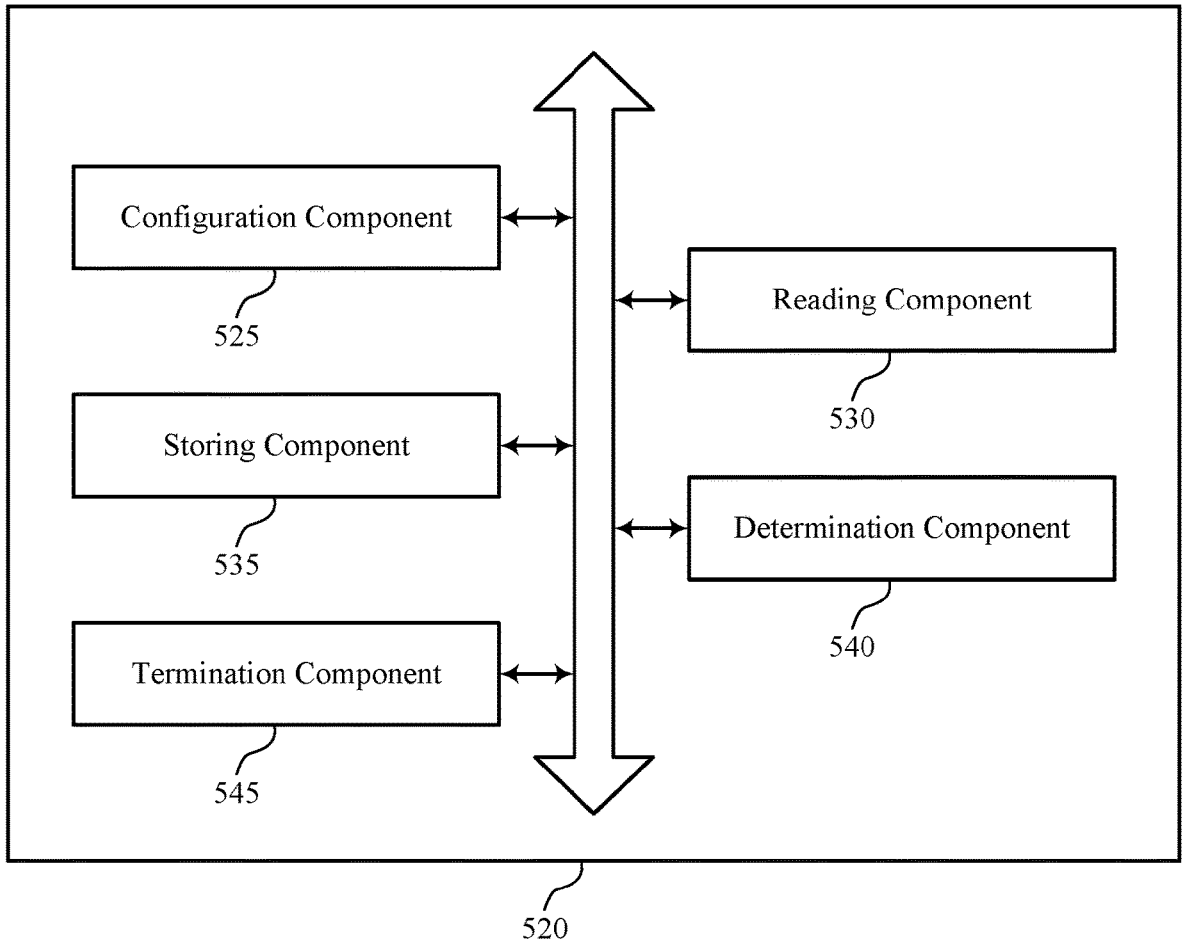
FIG. 5 shows a block diagram of a memory system that supports techniques for threshold voltage scans in accordance with examples as disclosed herein.

FIG. 5 shows a block diagram 500 of a memory system 520 that supports techniques for threshold voltage scans in accordance with examples as disclosed herein. The memory system 520 may be an example of aspects of a memory system as described with reference to FIGS. 1 through 4. The memory system 520, or various components thereof, may be an example of means for performing various aspects of techniques for threshold voltage scans as described herein. For example, the memory system 520 may include a configuration component 525, a reading component 530, a storing component 535, a determination component 540, a termination component 545, or any combination thereof. Each of these components may communicate, directly or indirectly, with one another (e.g., via one or more buses).

The configuration component 525 may be configured as or otherwise support a means for receiving a configuration for scanning a memory array during a scanning procedure. The reading component 530 may be configured as or otherwise support a means for reading, during the scanning procedure, one or more memory cells of the memory array using a first voltage value that is based at least in part on the configuration. The storing component 535 may be configured as or otherwise support a means for storing, during the scanning procedure, a first value in a first counter based at least in part on reading the one or more memory cells of the memory array, the first value corresponding to a first quantity of memory cells of the memory array. The determination component 540 may be configured as or otherwise support a means for determining whether to terminate the scanning procedure based at least in part on one or both of whether the first quantity of memory cells satisfies a threshold quantity of memory cells or whether the first voltage value satisfies a threshold voltage value to be scanned.

In some examples, the termination component 545 may be configured as or otherwise support a means for terminating the scanning procedure based at least in part on determining that the first quantity of memory cells satisfies the threshold quantity of memory cells or the first voltage value satisfies the threshold voltage value, or both.

In some examples, the termination component 545 may be configured as or otherwise support a means for refraining from terminating the scanning procedure based at least in part on determining that the first quantity of memory cells fails to satisfy the threshold quantity of memory cells or the first voltage value fails to satisfy the threshold voltage value, or both.

In some examples, the termination component 545 may be configured as or otherwise support a means for determining whether the first value stored in the first counter is equal to a first value stored in a second counter based at least in part on refraining from terminating the scanning procedure, and the second counter may be configured to store values previously stored in the first counter.

In some examples, the determination component 540 may be configured as or otherwise support a means for determining a voltage step size value based at least in part on determining that the first value stored in the first counter is equal to the first value stored in the second counter. In some examples, the determination component 540 may be configured as or otherwise support a means for determining a first voltage offset value based at least in part on determining the voltage step size value.

In some examples, the determination component 540 may be configured as or otherwise support a means for determining a second voltage value based at least in part on the first voltage value and the first voltage offset value. In some examples, the storing component 535 may be configured as or otherwise support a means for storing, in the second counter, the first value stored in the first counter.

In some examples, the reading component 530 may be configured as or otherwise support a means for reading the one or more memory cells of the memory array using the second voltage value during the scanning procedure. In some examples, the storing component 535 may be configured as or otherwise support a means for storing a second value in the first counter based at least in part on reading the one or more memory cells of the memory array, the second value corresponding to a second quantity of memory cells of the memory array. In some examples, the determination component 540 may be configured as or otherwise support a means for determining whether to terminate the scanning procedure based at least in part on whether the second quantity of memory cells satisfies the threshold quantity of memory cells or whether the second voltage value satisfies the threshold voltage value, or both.

In some examples, the determination component 540 may be configured as or otherwise support a means for determining whether a second voltage offset value is equal to a multiple of a voltage step size value.

In some examples, the determination component 540 may be configured as or otherwise support a means for determining a second voltage value based at least in part on the first voltage value and a first voltage offset value, and the first voltage offset value may be based at least in part on the voltage step size value and determining the second voltage value may be based at least in part on determining that the second voltage offset value is different from the multiple of the voltage step size value. In some examples, the storing component 535 may be configured as or otherwise support a means for storing, in the second counter, the first value stored in the first counter.

In some examples, the determination component 540 may be configured as or otherwise support a means for determining a third voltage offset value based at least in part on determining that the second voltage offset value is equal to the multiple of the voltage step size value, and the third voltage offset value may be equal to the voltage step size value. In some examples, the determination component 540 may be configured as or otherwise support a means for determining a second voltage value based at least in part on a difference between the second voltage offset value and the first voltage value. In some examples, the storing component 535 may be configured as or otherwise support a means for storing, in the second counter, the first value stored in the first counter.

In some examples, the reading component 530 may be configured as or otherwise support a means for reading the one or more memory cells of the memory array using the second voltage value during the scanning procedure. In some examples, the storing component 535 may be configured as or otherwise support a means for storing a second value in the first counter based at least in part on reading the one or more memory cells of the memory array, the second value corresponding to a second quantity of memory cells of the memory array. In some examples, the determination component 540 may be configured as or otherwise support a means for determining whether to terminate the scanning procedure based at least in part on whether the second quantity of memory cells satisfies the threshold quantity of memory cells or whether the second voltage value satisfies the threshold voltage value, or both.

Figure 6:
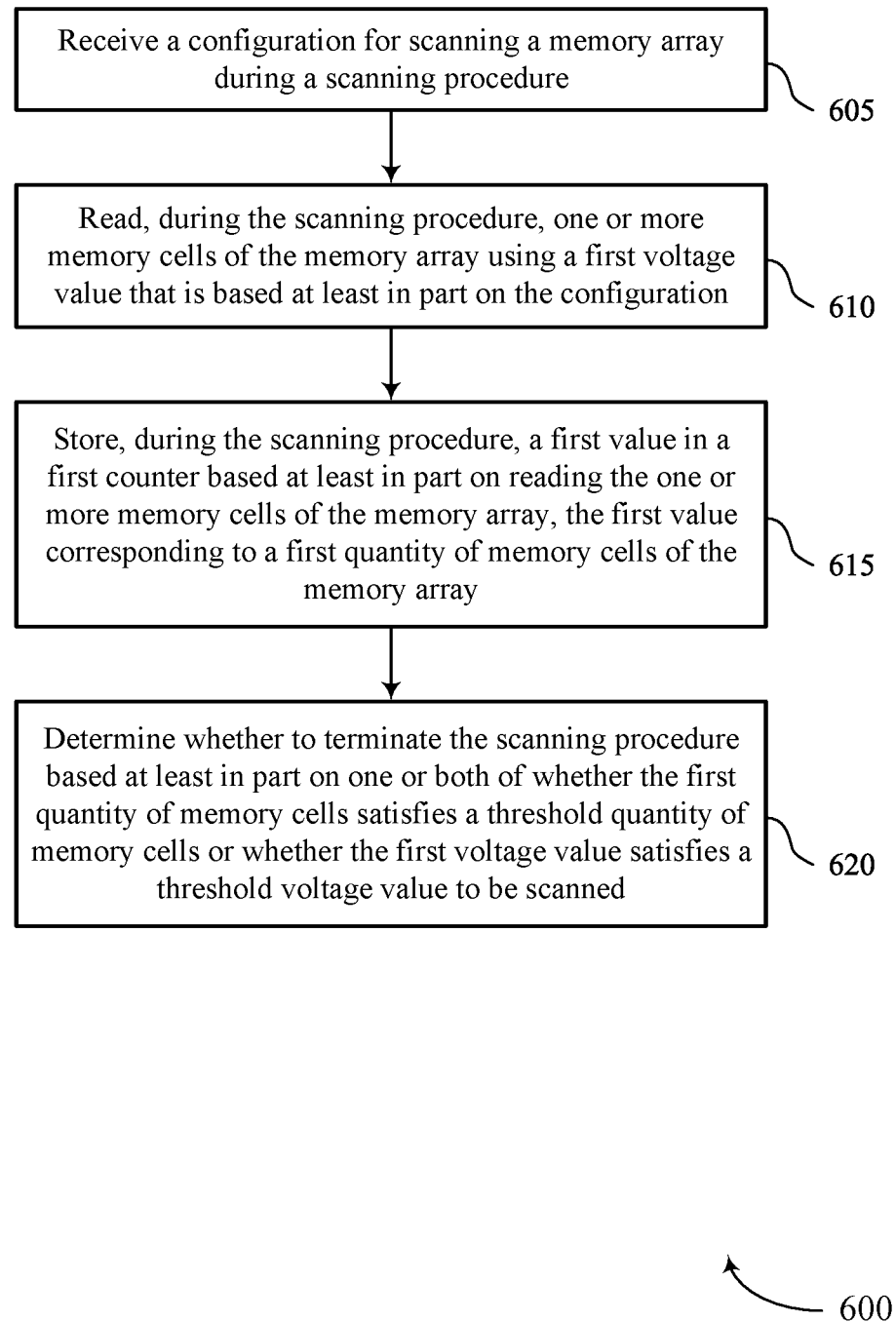
FIGS. 6 and 7 show flowcharts illustrating a method or methods that support techniques for threshold voltage scans in accordance with examples as disclosed herein.

FIG. 6 shows a flowchart illustrating a method 600 that supports techniques for threshold voltage scans in accordance with examples as disclosed herein. The operations of method 600 may be implemented by a memory system or its components as described herein. For example, the operations of method 600 may be performed by a memory system as described with reference to FIGS. 1 through 5. In some examples, a memory system may execute a set of instructions to control the functional elements of the device to perform the described functions. Additionally, or alternatively, the memory system may perform aspects of the described functions using special-purpose hardware.

At 605, the method may include receiving a configuration for scanning a memory array during a scanning procedure. The operations of 605 may be performed in accordance with examples as disclosed herein. In some examples, aspects of the operations of 605 may be performed by a configuration component 525 as described with reference to FIG. 5.

At 610, the method may include reading, during the scanning procedure, one or more memory cells of the memory array using a first voltage value that is based at least in part on the configuration. The operations of 610 may be performed in accordance with examples as disclosed herein. In some examples, aspects of the operations of 610 may be performed by a reading component 530 as described with reference to FIG. 5.

At 615, the method may include storing, during the scanning procedure, a first value in a first counter based at least in part on reading the one or more memory cells of the memory array, the first value corresponding to a first quantity of memory cells of the memory array. The operations of 615 may be performed in accordance with examples as disclosed herein. In some examples, aspects of the operations of 615 may be performed by a storing component 535 as described with reference to FIG. 5.

At 620, the method may include determining whether to terminate the scanning procedure based at least in part on one or both of whether the first quantity of memory cells satisfies a threshold quantity of memory cells or whether the first voltage value satisfies a threshold voltage value to be scanned. The operations of 620 may be performed in accordance with examples as disclosed herein. In some examples, aspects of the operations of 620 may be performed by a determination component 540 as described with reference to FIG. 5.

In some examples, an apparatus as described herein may perform a method or methods, such as the method 600. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving a configuration for scanning a memory array during a scanning procedure; reading, during the scanning procedure, one or more memory cells of the memory array using a first voltage value that is based at least in part on the configuration; storing, during the scanning procedure, a first value in a first counter based at least in part on reading the one or more memory cells of the memory array, the first value corresponding to a first quantity of memory cells of the memory array; and determining whether to terminate the scanning procedure based at least in part on one or both of whether the first quantity of memory cells satisfies a threshold quantity of memory cells or whether the first voltage value satisfies a threshold voltage value to be scanned.

Aspect 2: The method, apparatus, or non-transitory computer-readable medium of aspect 1, further including operations, features, circuitry, logic, means, or instructions, or any combination thereof for terminating the scanning procedure based at least in part on determining that the first quantity of memory cells satisfies the threshold quantity of memory cells or the first voltage value satisfies the threshold voltage value, or both.

Aspect 3: The method, apparatus, or non-transitory computer-readable medium of any of aspects 1 through 2, further including operations, features, circuitry, logic, means, or instructions, or any combination thereof for refraining from terminating the scanning procedure based at least in part on determining that the first quantity of memory cells fails to satisfy the threshold quantity of memory cells or the first voltage value fails to satisfy the threshold voltage value, or both.

Aspect 4: The method, apparatus, or non-transitory computer-readable medium of aspect 3, further including operations, features, circuitry, logic, means, or instructions, or any combination thereof for determining whether the first value stored in the first counter is equal to a first value stored in a second counter based at least in part on refraining from terminating the scanning procedure, where the second counter is configured to store values previously stored in the first counter.

Aspect 5: The method, apparatus, or non-transitory computer-readable medium of aspect 4, further including operations, features, circuitry, logic, means, or instructions, or any combination thereof for determining a voltage step size value based at least in part on determining that the first value stored in the first counter is equal to the first value stored in the second counter and determining a first voltage offset value based at least in part on determining the voltage step size value.

Aspect 6: The method, apparatus, or non-transitory computer-readable medium of aspect 5, further including operations, features, circuitry, logic, means, or instructions, or any combination thereof for determining a second voltage value based at least in part on the first voltage value and the first voltage offset value and storing, in the second counter, the first value stored in the first counter.

Aspect 7: The method, apparatus, or non-transitory computer-readable medium of aspect 6, further including operations, features, circuitry, logic, means, or instructions, or any combination thereof for reading the one or more memory cells of the memory array using the second voltage value during the scanning procedure; storing a second value in the first counter based at least in part on reading the one or more memory cells of the memory array, the second value corresponding to a second quantity of memory cells of the memory array; and determining whether to terminate the scanning procedure based at least in part on whether the second quantity of memory cells satisfies the threshold quantity of memory cells or whether the second voltage value satisfies the threshold voltage value, or both.

Aspect 8: The method, apparatus, or non-transitory computer-readable medium of any of aspects 4 through 7, further including operations, features, circuitry, logic, means, or instructions, or any combination thereof for determining whether a second voltage offset value is equal to a multiple of a voltage step size value.

Aspect 9: The method, apparatus, or non-transitory computer-readable medium of aspect 8, further including operations, features, circuitry, logic, means, or instructions, or any combination thereof for determining a second voltage value based at least in part on the first voltage value and a first voltage offset value, where the first voltage offset value is based at least in part on the voltage step size value and determining the second voltage value is based at least in part on determining that the second voltage offset value is different from the multiple of the voltage step size value and storing, in the second counter, the first value stored in the first counter.

Aspect 10: The method, apparatus, or non-transitory computer-readable medium of any of aspects 8 through 9, further including operations, features, circuitry, logic, means, or instructions, or any combination thereof for determining a third voltage offset value based at least in part on determining that the second voltage offset value is equal to the multiple of the voltage step size value, where the third voltage offset value is equal to the voltage step size value; determining a second voltage value based at least in part on a difference between the second voltage offset value and the first voltage value; and storing, in the second counter, the first value stored in the first counter.

Aspect 11: The method, apparatus, or non-transitory computer-readable medium of aspect 10, further including operations, features, circuitry, logic, means, or instructions, or any combination thereof for reading the one or more memory cells of the memory array using the second voltage value during the scanning procedure; storing a second value in the first counter based at least in part on reading the one or more memory cells of the memory array, the second value corresponding to a second quantity of memory cells of the memory array; and determining whether to terminate the scanning procedure based at least in part on whether the second quantity of memory cells satisfies the threshold quantity of memory cells or whether the second voltage value satisfies the threshold voltage value, or both.

Figure 7:
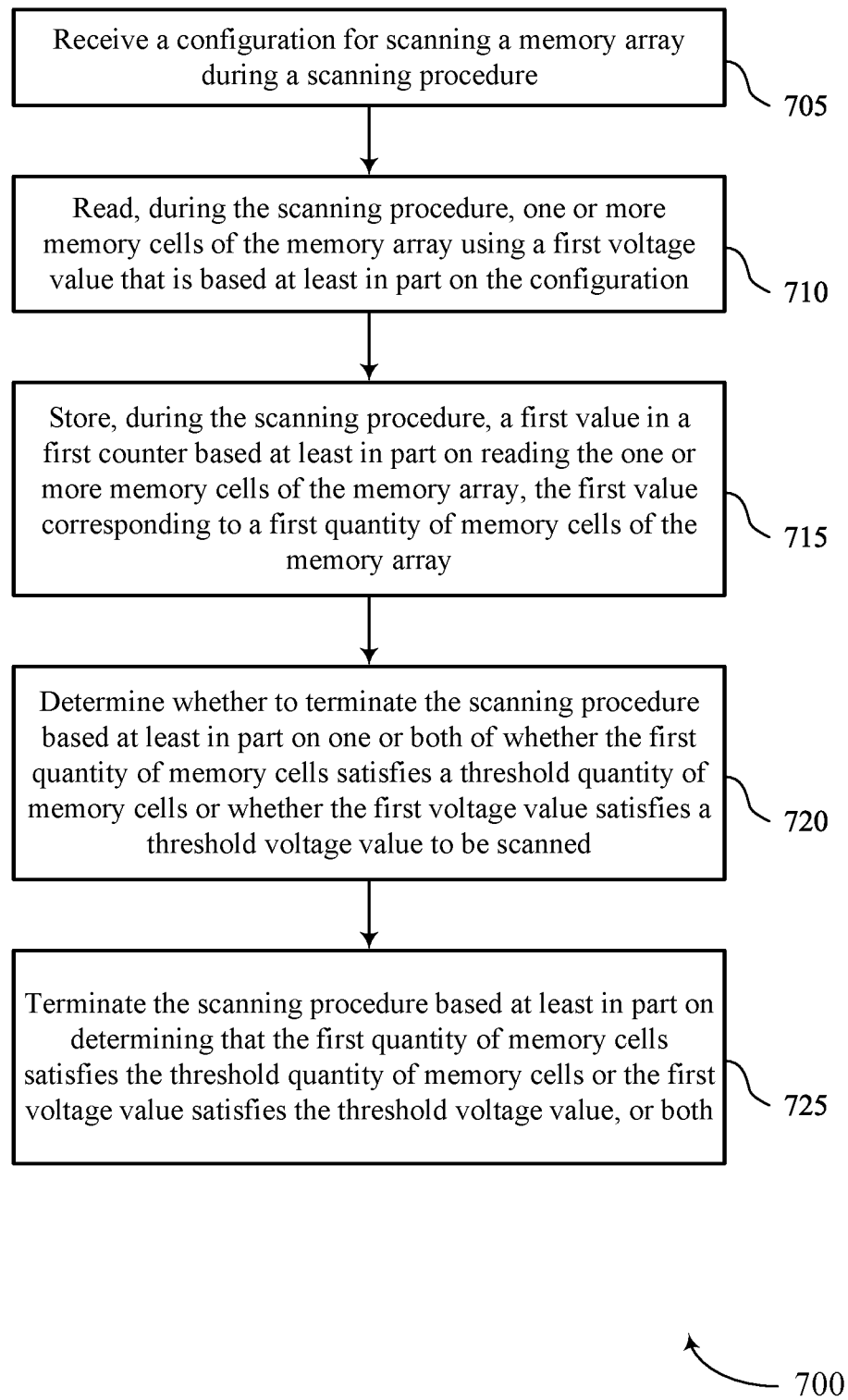

FIG. 7 shows a flowchart illustrating a method 700 that supports techniques for threshold voltage scans in accordance with examples as disclosed herein. The operations of method 700 may be implemented by a memory system or its components as described herein. For example, the operations of method 700 may be performed by a memory system as described with reference to FIGS. 1 through 5. In some examples, a memory system may execute a set of instructions to control the functional elements of the device to perform the described functions. Additionally, or alternatively, the memory system may perform aspects of the described functions using special-purpose hardware.

At 705, the method may include receiving a configuration for scanning a memory array during a scanning procedure. The operations of 705 may be performed in accordance with examples as disclosed herein. In some examples, aspects of the operations of 705 may be performed by a configuration component 525 as described with reference to FIG. 5.

At 710, the method may include reading, during the scanning procedure, one or more memory cells of the memory array using a first voltage value that is based at least in part on the configuration. The operations of 710 may be performed in accordance with examples as disclosed herein. In some examples, aspects of the operations of 710 may be performed by a reading component 530 as described with reference to FIG. 5.

At 715, the method may include storing, during the scanning procedure, a first value in a first counter based at least in part on reading the one or more memory cells of the memory array, the first value corresponding to a first quantity of memory cells of the memory array. The operations of 715 may be performed in accordance with examples as disclosed herein. In some examples, aspects of the operations of 715 may be performed by a storing component 535 as described with reference to FIG. 5.

At 720, the method may include determining whether to terminate the scanning procedure based at least in part on one or both of whether the first quantity of memory cells satisfies a threshold quantity of memory cells or whether the first voltage value satisfies a threshold voltage value to be scanned. The operations of 720 may be performed in accordance with examples as disclosed herein. In some examples, aspects of the operations of 720 may be performed by a determination component 540 as described with reference to FIG. 5.

At 725, the method may include terminating the scanning procedure based at least in part on determining that the first quantity of memory cells satisfies the threshold quantity of memory cells or the first voltage value satisfies the threshold voltage value, or both. The operations of 725 may be performed in accordance with examples as disclosed herein. In some examples, aspects of the operations of 725 may be performed by a termination component 545 as described with reference to FIG. 5.

It should be noted that the described techniques include possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A memory system, comprising:
   one or more memory devices; and
   one or more controllers coupled with the one or more memory devices and configured to cause the memory system to:
      receive a configuration for scanning a memory array during a scanning procedure;
      read, during the scanning procedure, one or more memory cells of the memory array using a first voltage value of a plurality of incremental voltage values that are in accordance with the configuration;
      store, during the scanning procedure, a first value in a first counter in response to reading the one or more memory cells of the memory array, the first value corresponding to a first quantity of memory cells of the memory array; and
      determine whether to terminate the scanning procedure in accordance with one or both of whether the first quantity of memory cells satisfies a threshold quantity of memory cells or whether the first voltage value satisfies a threshold voltage value associated with the one or more memory cells.

2. The memory system of claim 1, wherein the one or more controllers are further configured to cause the memory system to:
   terminate the scanning procedure in response to determining that the first quantity of memory cells satisfies the threshold quantity of memory cells or the first voltage value satisfies the threshold voltage value, or both.

3. The memory system of claim 1, wherein the one or more controllers are further configured to cause the memory system to:
   refrain from terminating the scanning procedure in response to determining that the first quantity of memory cells fails to satisfy the threshold quantity of memory cells or the first voltage value fails to satisfy the threshold voltage value, or both.

4. The memory system of claim 3, wherein the one or more controllers are further configured to cause the memory system to:
determine whether the first value stored in the first counter is equal to a first value stored in a second counter in response to refraining from terminating the scanning procedure, wherein the second counter is configured to store values previously stored in the first counter.

5. The memory system of claim 4, wherein the one or more controllers are further configured to cause the memory system to:
determine a voltage step size value in response to determining that the first value stored in the first counter is equal to the first value stored in the second counter; and
determine a first voltage offset value in response to determining the voltage step size value.

6. The memory system of claim 5, wherein the one or more controllers are further configured to cause the memory system to:
determine a second voltage value of the plurality of incremental voltage values in accordance with the first voltage value and the first voltage offset value; and
store, in the second counter, the first value stored in the first counter.

7. The memory system of claim 6, wherein the one or more controllers are further configured to cause the memory system to:
read the one or more memory cells of the memory array using the second voltage value during the scanning procedure;
store a second value in the first counter in response to reading the one or more memory cells of the memory array, the second value corresponding to a second quantity of memory cells of the memory array; and
determine whether to terminate the scanning procedure in accordance with whether the second quantity of memory cells satisfies the threshold quantity of memory cells or whether the second voltage value satisfies the threshold voltage value, or both.

8. The memory system of claim 4, wherein the one or more controllers are further configured to cause the memory system to:
determine whether a second voltage offset value is equal to a multiple of a voltage step size value.

9. The memory system of claim 8, wherein the one or more controllers are further configured to cause the memory system to:
determine a second voltage value of the plurality of incremental voltage values in accordance with the first voltage value and a first voltage offset value, wherein the first voltage offset value is in accordance with the voltage step size value and determining the second voltage value is in response to determining that the second voltage offset value is different from the multiple of the voltage step size value; and
store, in the second counter, the first value stored in the first counter.

10. The memory system of claim 8, wherein the one or more controllers are further configured to cause the memory system to:
determine a third voltage offset value in response to determining that the second voltage offset value is equal to the multiple of the voltage step size value, wherein the third voltage offset value is equal to the voltage step size value;
determine a second voltage value of the plurality of incremental voltage values in accordance with a difference between the second voltage offset value and the first voltage value; and
store, in the second counter, the first value stored in the first counter.

11. The memory system of claim 10, wherein the one or more controllers are further configured to cause the memory system to:
read the one or more memory cells of the memory array using the second voltage value during the scanning procedure;
store a second value in the first counter in response to reading the one or more memory cells of the memory array, the second value corresponding to a second quantity of memory cells of the memory array; and
determine whether to terminate the scanning procedure in accordance with whether the second quantity of memory cells satisfies the threshold quantity of memory cells or whether the second voltage value satisfies the threshold voltage value, or both.

12. A non-transitory computer-readable medium storing code comprising instructions which, when executed by one or more processors of an electronic device, cause the electronic device to:
receive a configuration for scanning a memory array during a scanning procedure;
read, during the scanning procedure, one or more memory cells of the memory array using a first voltage value of a plurality of incremental voltage values that are in accordance with the configuration;
store, during the scanning procedure, a first value in a first counter in response to reading the one or more memory cells of the memory array, the first value corresponding to a first quantity of memory cells of the memory array; and
determine whether to terminate the scanning procedure in accordance with one or both of whether the first quantity of memory cells satisfies a threshold quantity of memory cells or whether the first voltage value satisfies a threshold voltage value associated with the one or more memory cells.

13. The non-transitory computer-readable medium of claim 12, wherein the instructions, when executed by the one or more processors of the electronic device, further cause the electronic device to:
terminate the scanning procedure in response to determining that the first quantity of memory cells satisfies the threshold quantity of memory cells or the first voltage value satisfies the threshold voltage value, or both.

14. The non-transitory computer-readable medium of claim 12, wherein the instructions, when executed by the one or more processors of the electronic device, further cause the electronic device to:
refrain from terminating the scanning procedure in response to determining that the first quantity of memory cells fails to satisfy the threshold quantity of memory cells or the first voltage value fails to satisfy the threshold voltage value, or both.

15. The non-transitory computer-readable medium of claim 14, wherein the instructions, when executed by the one or more processors of the electronic device, further cause the electronic device to:
determine whether the first value stored in the first counter is equal to a first value stored in a second counter in response to refraining from terminating the scanning procedure, wherein the second counter is configured to store values previously stored in the first counter.

16. The non-transitory computer-readable medium of claim 15, wherein the instructions, when executed by the one or more processors of the electronic device, further cause the electronic device to:
   determine a voltage step size value in response to determining that the first value stored in the first counter is equal to the first value stored in the second counter; and
   determine a first voltage offset value in response to determining the voltage step size value.

17. The non-transitory computer-readable medium of claim 16, wherein the instructions, when executed by the one or more processors of the electronic device, further cause the electronic device to:
   determine a second voltage value of the plurality of incremental voltage values in accordance with the first voltage value and the first voltage offset value; and
   store, in the second counter, the first value stored in the first counter.

18. The non-transitory computer-readable medium of claim 17, wherein the instructions, when executed by the one or more processors of the electronic device, further cause the electronic device to:
   read the one or more memory cells of the memory array using the second voltage value during the scanning procedure;
   store a second value in the first counter in response to reading the one or more memory cells of the memory array, the second value corresponding to a second quantity of memory cells of the memory array; and
   determine whether to terminate the scanning procedure in accordance with whether the second quantity of memory cells satisfies the threshold quantity of memory cells or whether the second voltage value satisfies the threshold voltage value, or both.

19. The non-transitory computer-readable medium of claim 15, wherein the instructions, when executed by the one or more processors of the electronic device, further cause the electronic device to:
   determine whether a second voltage offset value is equal to a multiple of a voltage step size value.

20. A method by a memory system, comprising:
   receiving a configuration for scanning a memory array during a scanning procedure;
   reading, during the scanning procedure, one or more memory cells of the memory array using a first voltage value of a plurality of incremental voltage values that are in accordance with the configuration;
   storing, during the scanning procedure, a first value in a first counter in response to reading the one or more memory cells of the memory array, the first value corresponding to a first quantity of memory cells of the memory array; and
   determining whether to terminate the scanning procedure in accordance with one or both of whether the first quantity of memory cells satisfies a threshold quantity of memory cells or whether the first voltage value satisfies a threshold voltage value associated with the one or more memory cells.

* * * * *